United States Patent [19]

Scepanovic et al.

[11] Patent Number: 5,909,376
[45] Date of Patent: Jun. 1, 1999

[54] PHYSICAL DESIGN AUTOMATION SYSTEM AND PROCESS FOR DESIGNING INTEGRATED CIRCUIT CHIPS USING HIGHLY PARALLEL SIEVE OPTIMIZATION WITH MULTIPLE "JIGGLES"

[75] Inventors: Ranko Scepanovic; James S. Koford, both of San Jose, Calif.; Valeriy B. Kudryavtsev, Moscow, Russian Federation; Alexander E. Andreev, Moskovskaja Oblast, Russian Federation; Stanislav V. Aleshin; Alexander S. Podkolzin, both of Moscow, Russian Federation; Edward M. Roseboom, San Carlos, Calif.

[73] Assignee: LSI Logic Corporation, Milpitas, Calif.

[21] Appl. No.: 08/560,848

[22] Filed: Nov. 20, 1995

[51] Int. Cl.$^6$ ....................................................... G06F 17/50
[52] U.S. Cl. ........................... 364/491; 364/489; 364/490
[58] Field of Search .............................. 364/488–91, 578, 364/468; 357/45; 345/921

[56] References Cited

U.S. PATENT DOCUMENTS

| 4,701,778 | 10/1987 | Aneha et al. | 357/45 |
| 5,051,917 | 9/1991 | Gould et al. | 364/489 |
| 5,490,419 | 2/1996 | Rostoker et al. | 364/468 |
| 5,495,419 | 2/1996 | Rostoker et al. | 364/468 |
| 5,513,119 | 4/1996 | Moore et al. | 364/491 |
| 5,566,078 | 10/1996 | Ding et al. | 364/490 |
| 5,699,265 | 12/1997 | Scepanovic et al. | 364/491 |

OTHER PUBLICATIONS

Sun et al. ("Efficient and effective placement for very large circuits", IEEE Transaction on Computer–Aided Design of Integrated Circuits and Systems, vol. 14, No. 3, pp. 349–359, Mar. 1995).

Byrne, R. Et al. ("Distributed system for VLSI layout compaction", IEE Proceedings—Computers and Digital Techniques, vol. 141, No. 1, Jan. 1994, pp. 49–56).

Chalasani, R. P. Et al. ("Parallel computing for network optimization: a cluster–based approach for the dual transshipment problem", IEEE Comput. Soc. Press, Proceedings of the Seventh IEEE Symposium on Parallel and Distributed Processing, Oct. 25, 1995.

Mohanadi, A.H.A. ("Concurrent placement algorithm and floor planning based on Occam and the trsputer technology", IEEE, Proceedings of the 1994 IEEE Southeastcon '94: Creative Technology Transfer– A Global Affairs, Apr. 10, 1994, pp. 123–127).

(List continued on next page.)

Primary Examiner—Kevin J. Teska
Assistant Examiner—Phallaka Kik
Attorney, Agent, or Firm—Mitchell, Silberberg & Knupp LLP

[57] ABSTRACT

A process for implementation on a programmed digital computer includes providing a placement of clusters of cells which are assigned to regions on an integrated circuit chip, and combining the regions to form region groups. The region groups collectively constitute a "jiggle" which resembles a sieve. The clusters in each region group are re-assigned to the regions in the region group. The regions are recombined to form different region groups (a different jiggle), and the clusters in each different region group are re-assigned to the regions in the different region group. These steps are repeated using at least two, preferably four different jiggles, until an end criterion is reached. Then, the regions and clusters are hierarchically subdivided, and the process is repeated for each hierarchical level until the clusters have been reduced to individual cells. The regions of the region groups at each level are contiguous, and the region groups overlap, such that a cluster can be moved from any region to any other region on the chip by sufficient repetition of the assignment step using alternating jiggles.

32 Claims, 13 Drawing Sheets

OTHER PUBLICATIONS

Pao, D.C.W.. ("Parallel implementation of simulated annealing using transaction processing: a preliminary study", IEEE, Proceedings of the 1994 IEEE Region 10's Ninth Annual International Conference, vol. 1, Aug. 22, 1994, pp. 72–76).

Klanhans et al., "Gordian: VLSI Placement by Quadric Programming and Slicing Optimization", IEEE Trans. on CAD, pp. 356–365, 1991.

Sun et al., "A Loosely Coupled Parallel Algorithm for Standard Cell Placement", Proceedings of IEEE/ACM IC–CAD Conference, pp. 137–144, 1994.

Sechan et al., "An Improved Simulated Annealing Algorithm for Row–Based Placement", Proceedings of the IEEE Conference on CAD, pp. 478–481, 1987.

Fiduccia et al., "A Linear Time Heuristics for Improving Network Partitions", Proc. of the 19th DAC, pp. 175–181, 1992.

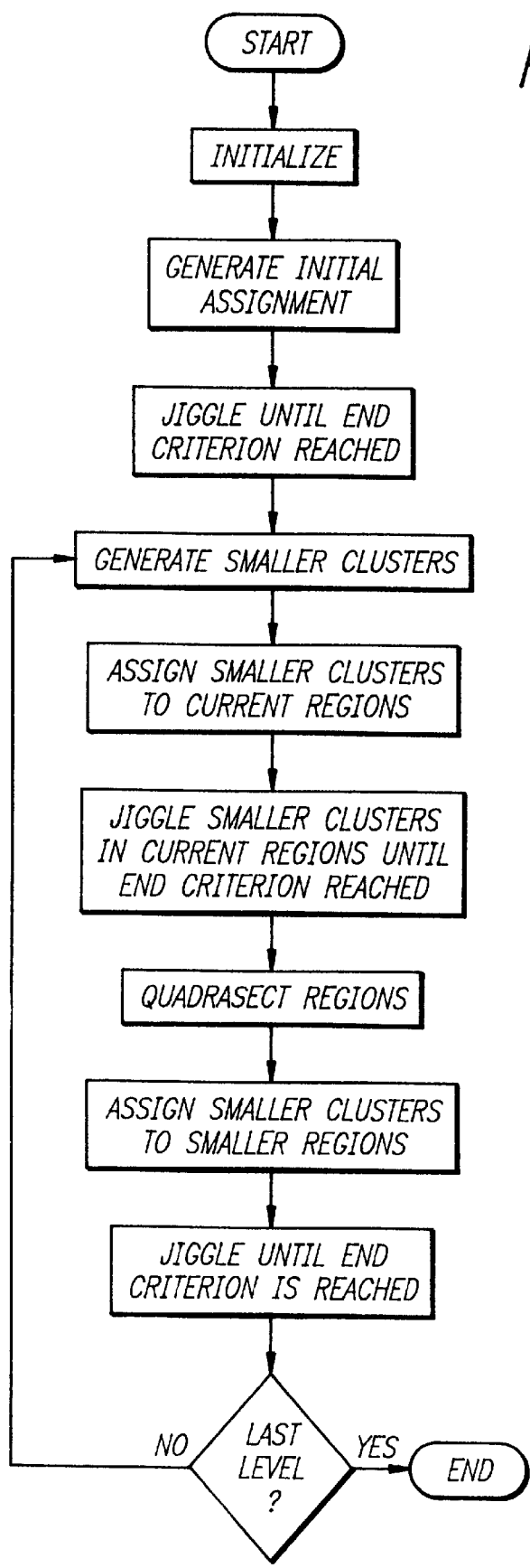

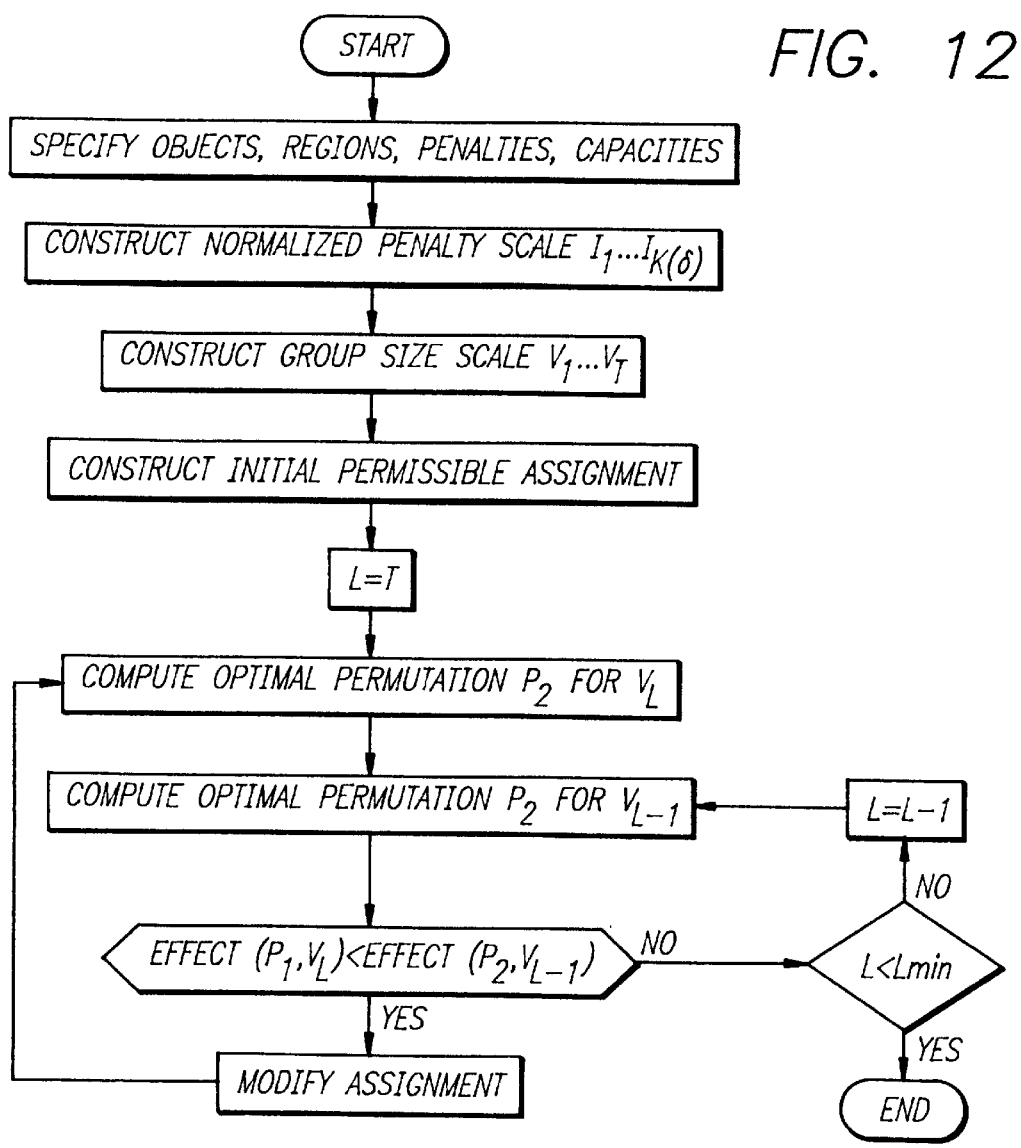

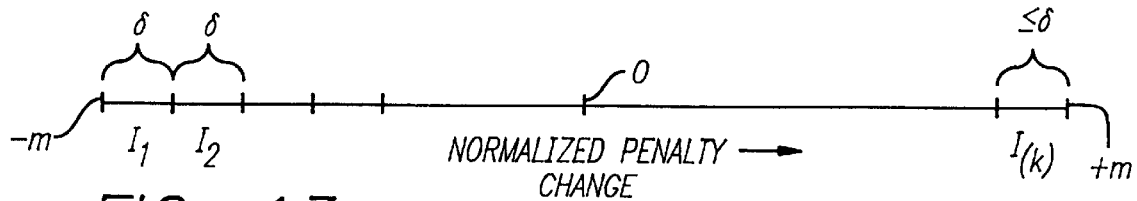

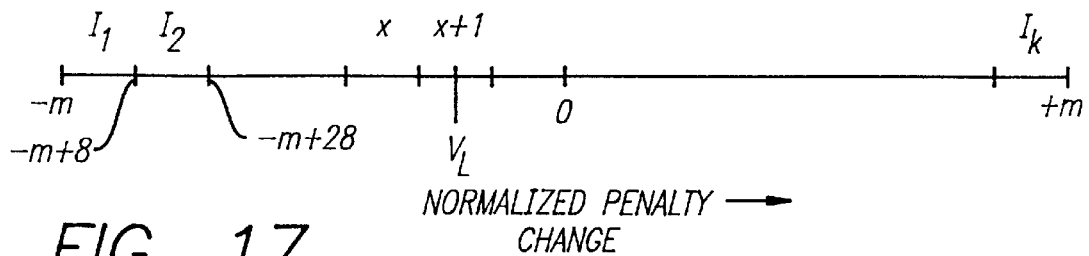
FIG. 17
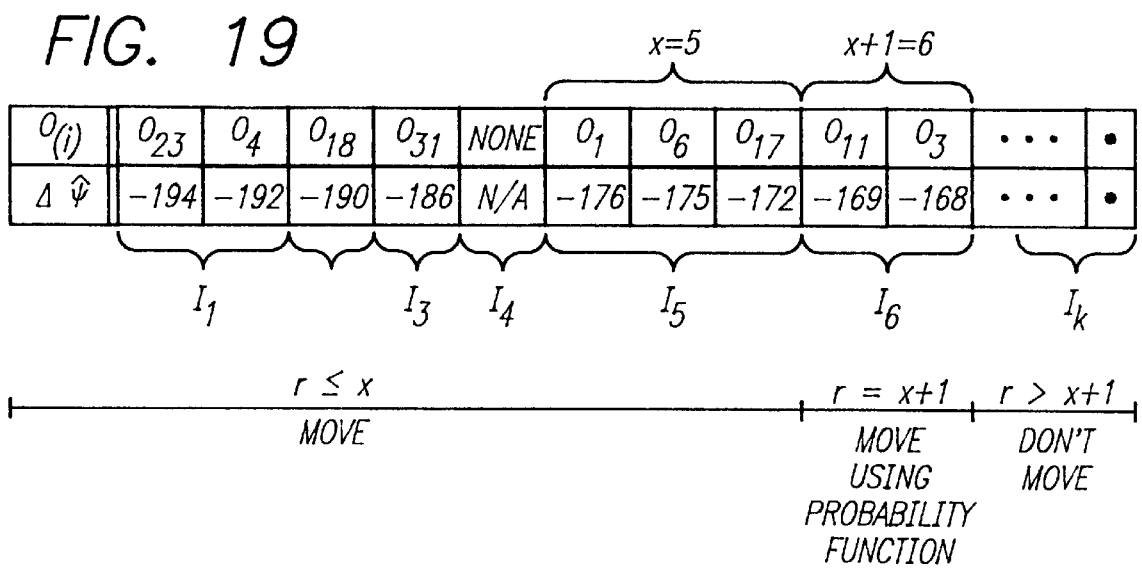
FIG. 18
FIG. 19

PHYSICAL DESIGN AUTOMATION SYSTEM AND PROCESS FOR DESIGNING INTEGRATED CIRCUIT CHIPS USING HIGHLY PARALLEL SIEVE OPTIMIZATION WITH MULTIPLE "JIGGLES"

BACKGROUND OF THE INVENTION

1. Field of the Invention

The present invention generally relates to the art of microelectronic integrated circuits, and more specifically to a physical design automation system and process for designing integrated circuit chips using highly parallel sieve optimization with multiple "jiggles".

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including Genetic Algorithms such as simulated evolution, force directed placement or simulated annealing, and comparing the resulting placements using a cost criteria.

In conventional chip design, the positions of certain "unmovable" cells (external interconnect terminals or pads, large "megacells" etc.) will be fixed a priori by the designer. Given those fixed positions, the rest of the cells are then placed on the chip. Since the unmovable cells and pads are located or placed before the placement for the rest of the cells of chip has been decided on, it is unlikely that the chosen positions will be optimal.

In this manner, a number of regions, which may have different sizes and shapes, are defined on the chip for placement of the rest of the cells.

It is desirable to assign individual microelectronic devices or cells to the regions, or "partition" the placement such that the total interconnect wirelength is minimized. However, methodologies for accomplishing this goal efficiently have not been proposed heretofore.

The general partitioning methodology is to hierarchically partition a large circuit into a group of smaller subcircuits until each subcircuit is small enough to be designed efficiently. Because the quality of the design may suffer due to the partitioning, the partitioning of a circuit has to be done carefully.

One of the most common objectives of partitioning is to minimize the cutsize which is defined as a number of nets crossing a cut. Also the number of partitions often appears as a constraint with upper and lower bounds. At chip level, the number of partitions is determined, in part, by the capability of the placement algorithm.

The prior art accomplishes partitioning by means of a series of "bipartitioning" problems, in which a decision is made to assign a component to one of two regions. Each component is hierarchically bipartitioned until the desired number of components is achieved.

Numerous methodologies for cell placement and assignment are known in the art. These include quadratic optimization as disclosed in an article entitled "GORDIAN: VLSI Placement by Quadratic Programming and Slicing Optimization", by J. Kleinhans et al, IEEE Trans. on CAD, 1991, pp. 356–365, and simulated annealing as described in an article entitled "A Loosely Coupled Parallel Algorithm for Standard Cell Placement", by W. Sun and C. Sechan, Proceedings of IEEE/ACM IC-CAD Conference, 1994, pp. 137–144.

The major drawbacks of these methodologies is they are sequential or almost sequential nature, have low capability for parallelization, and have long run times when implemented on a digital computer. These drawbacks are especially evident in a methodology described in an article entitled "An Improved Simulated Annealing Algorithm for Row-Based Placement", by C. Sechan and K. Lee, Proceedings of the IEEE Conference on CAD, 1987, pp. 478–481.

Prior art methods can not simultaneously solve the partitioning problem and the problem of placing partitions on the chip, and thereby their applicability to physical design automation systems for integrated circuit chip design is limited.

SUMMARY OF THE INVENTION

The present invention overcomes the drawbacks of the prior art by reducing the complexity of the placement and assignment problem into a series of small problems which can be solved concurrently using a parallel processing architecture with short run times.

In accordance with the present invention, global moves of cells are broken down (reduced) into a series of local moves without decreasing the depth of global optimization.

More specifically, a process which can be embodied as a programmed digital computer includes providing a placement of clusters of cells which are assigned to regions on an integrated circuit chip, and combining the regions to form region groups.

The region groups collectively constitute a "jiggle" which resembles a sieve. The clusters in each region group are re-assigned to the regions in the region group. The regions are recombined to form different region groups (a different jiggle), and the clusters in each different region group are re-assigned to the regions in the different region group.

These steps are repeated using at least two, preferably four different jiggles, until an end criterion is reached. Then, the regions and clusters are hierarchically subdivided, and the steps are repeated for each hierarchical level until the clusters have been reduced to individual cells.

The regions of the region groups at each level are contiguous, and the region groups overlap, such that a cluster can be moved from any region to any other region on the chip by sufficient repetition of the assignment step using alternating jiggles.

The present invention solves the partitioning problem and the problem of placing the partitions on the chip simultaneously, therefore overcoming the drawbacks of the prior art. This is accomplished by concurrently assigning cells to more than two regions, preferably four regions, as compared to only two regions (bipartitioning) as in the prior art.

The present invention is also capable of improving on an initial placement and assignment produced using a min-cut or other methodology, and can also be considered as a placement improvement process.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 7 is a flowchart illustrating the process of the present invention;

FIG. 11 is a diagram illustrating a two dimensional array of penalties for objects and regions;

FIG. 12 is a flowchart illustrating an assignment process step of the present invention;

FIG. 13 is a diagram illustrating the construction of a normalized penalty scale;

FIGS. 14 and 15 in combination illustrate the construction of a three dimensional array of normalized penalty summed values for subintervals;

FIG. 16 is a diagram illustrating normalized penalties as assigned to subintervals of the normalized penalty scale;

FIG. 17 is a diagram illustrating computation of a subinterval corresponding to a group size;

FIG. 18 is a diagram illustrating a two dimensional array of cost function change values;

FIG. 19 is a diagram illustrating movement of objects to produce a new assignment.

DETAILED DESCRIPTION OF THE INVENTION

Figure 1:
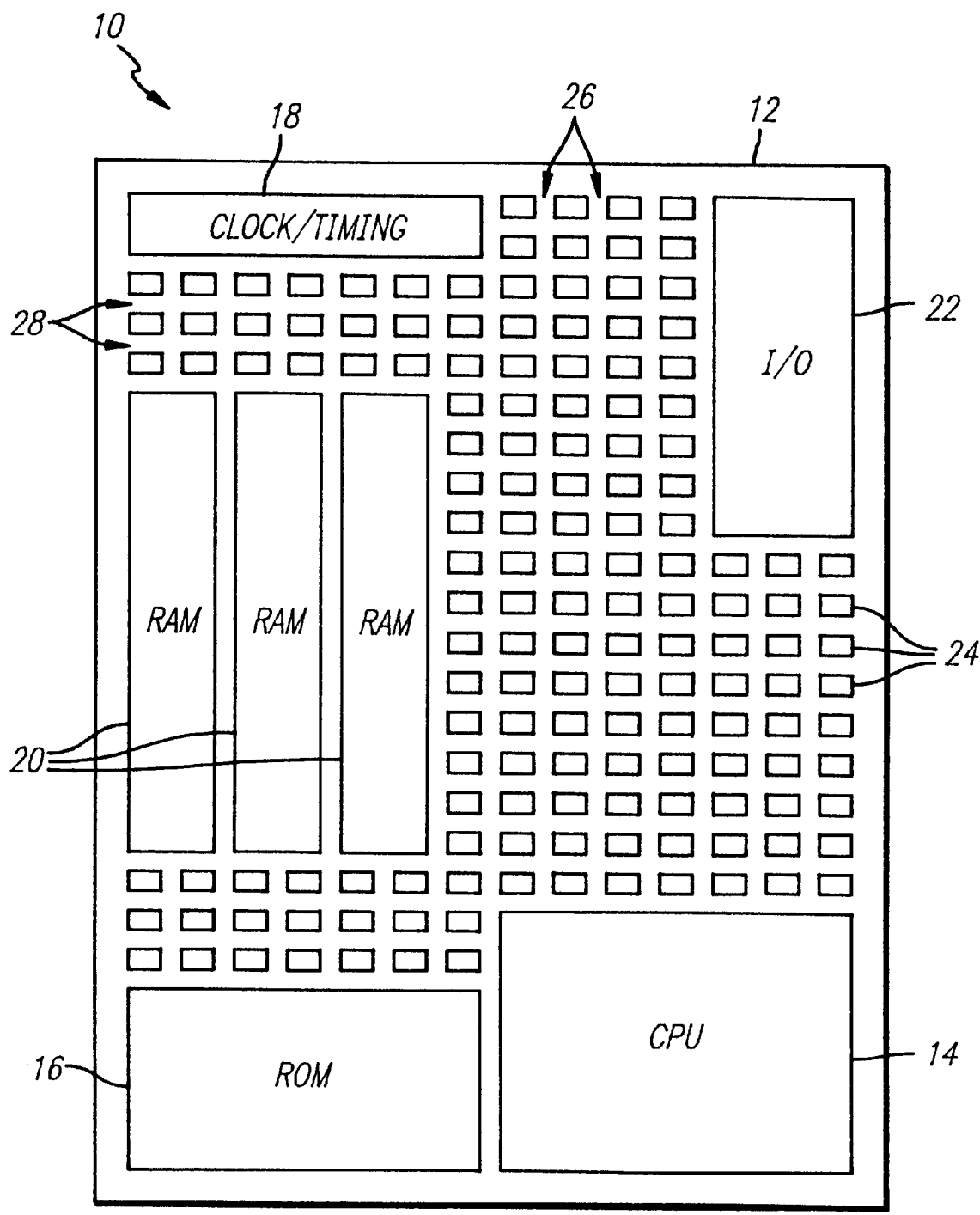
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
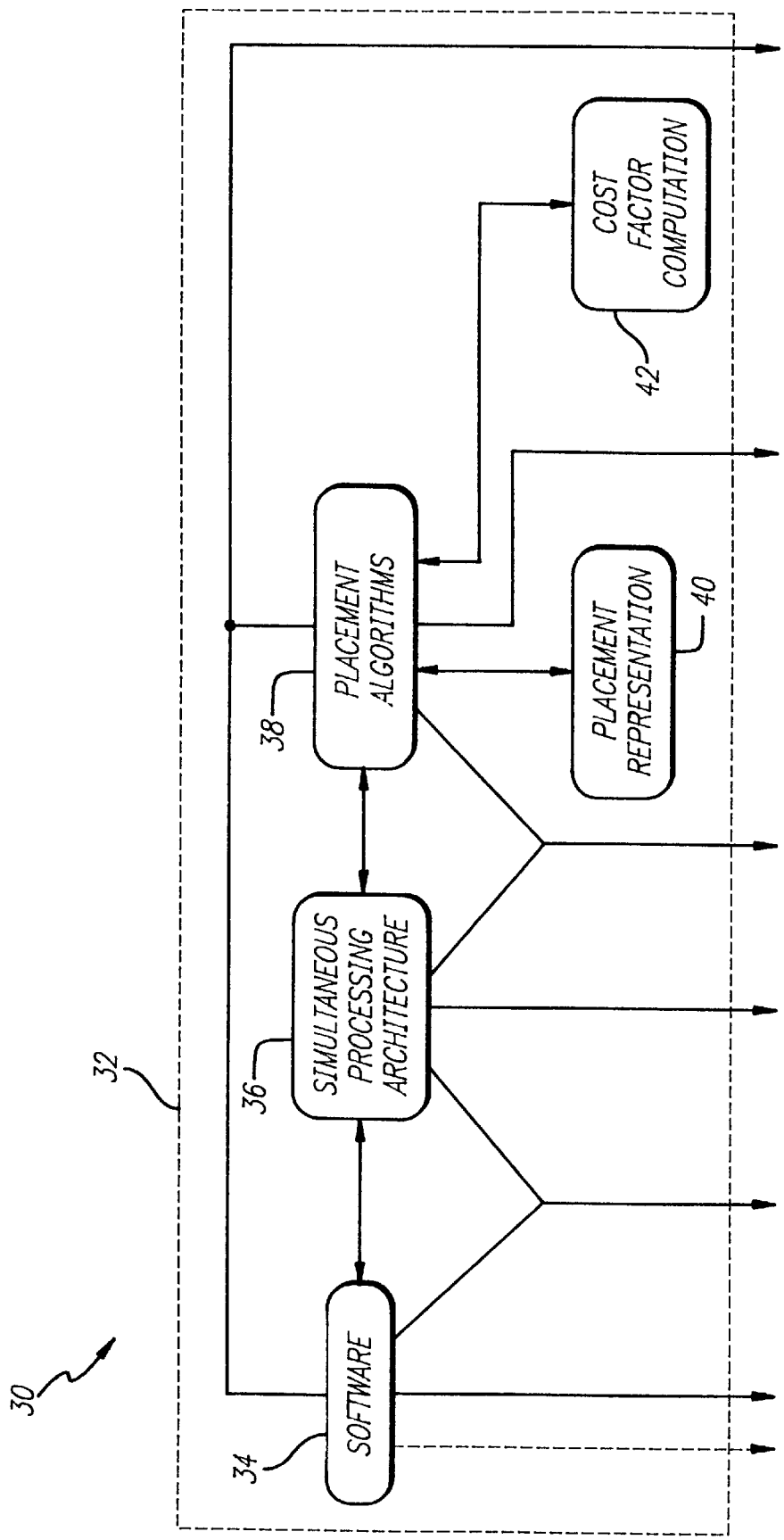
FIG. 2 is a diagram illustrating the main blocks of a multi-processing optimization system for practicing a method of the present invention.

FIG. 2 illustrates an integrated circuit physical design automation system 30 for producing an optimized placement of the cells 24 such as illustrated in FIG. 1 in accordance with a method of the present invention.

As will become evident from further description, system 30 is embodied as a programmed digital computer which generally comprises a processing means, memory means, and operating program which is stored in the memory means and executed by the processing means. The processing means preferably comprises a plurality of parallel processors for operating on a large number of areas of an integrated circuit cell placement concurrently.

The system 30 receives inputs for a user specified integrated circuit design including a netlist, a library of standardized microelectronic elements or cells and functional units including combinations of cells, and a set of rules that define the objectives of the design.

The architecture 36 collectively implements the required functionality of the present process by assigning different parallel processors to perform operations serially and/or concurrently, and combining the results thereof.

More specifically, the architecture 36 decomposes these functions into a plurality of parallel processes or tasks that are executed simultaneously using individual processing units. In general, one or more processors coordinate the operation of other processors, which are optimized, evaluated and recombined to produce an optimal cell placement which may or may not satisfy a predetermined performance objective.

The optimal cell placement produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or placement algorithms 38 for measuring the relative costs of cell placements and minimizing the costs. Implementation of the algorithms 38 is facilitated by a cell placement representation 40 and cost function or factor computation 42. The architecture 36 can be of any type, such as Distributed Shared Memory (DSM), that enables parallel processing in accordance with the method of the invention.

Figure 3:
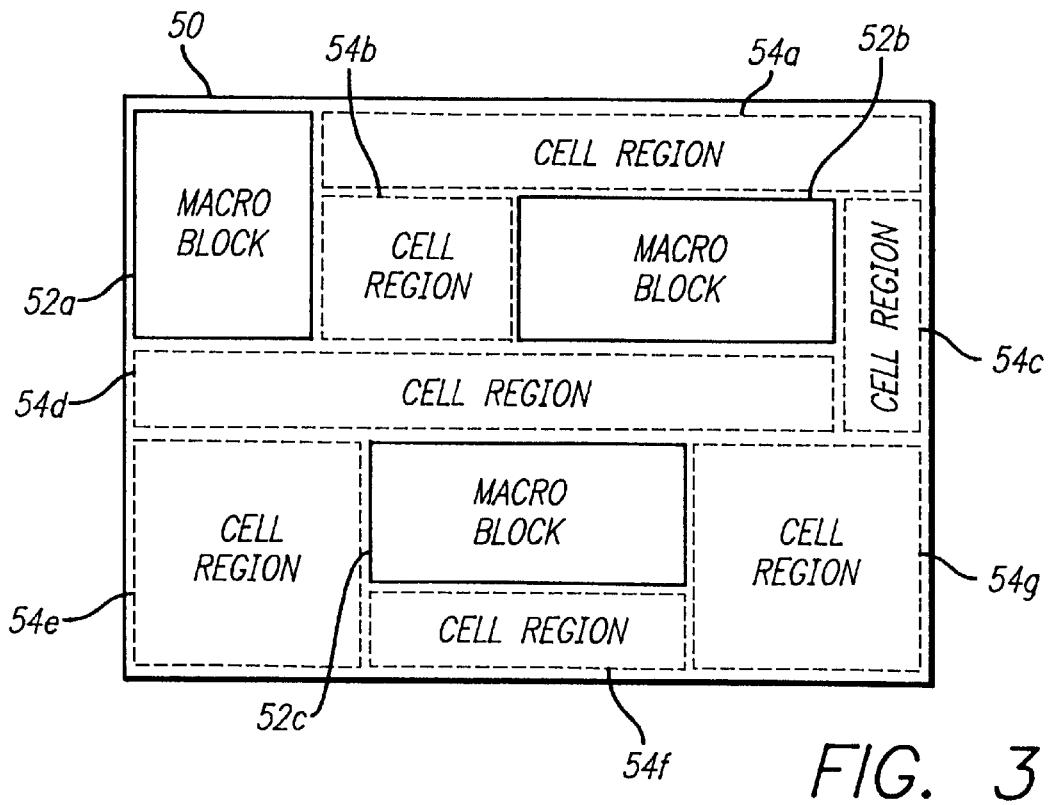
FIG. 3 is a diagram illustrating an integrated circuit chip including a plurality of macroblocks, and regions in which cells are to be placed by the present physical design automation system.

FIG. 3 illustrates one arrangement of regions in which cells are to be assigned or placed. An integrated circuit chip 50 includes a plurality of fixed macroblocks 52a to 52c as described with reference to FIG. 1. The irregularly shaped area which is not covered by the macroblocks 52a to 52c is divided into rectangular cell regions 54a to 54g having different sizes and shapes. A large number of cells, which are not illustrated in FIG. 3, are to be assigned to the regions 54a to 54g.

Figure 4:
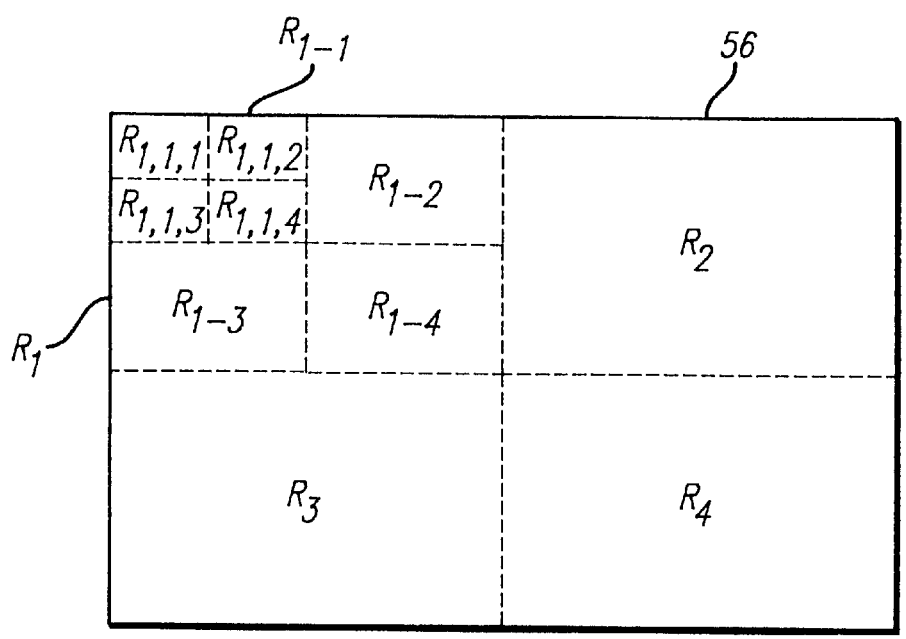
FIG. 4 is similar to FIG. 3, but illustrates a chip which is hierarchically partitioned into progressively smaller regions.

FIG. 4 illustrates another arrangement of regions in which cells are to be assigned or placed. An integrated circuit chip 56 has a single area in which a large number of cells are to be placed in a "Sea of Gates" configuration. The chip 56 is hierarchically divided into a plurality of regions and subregions. For example, as illustrated, the chip 56 is initially divided into four regions $R_1$ to $R_4$, which are in turn divided into four subregions.

For simplicity of illustration, only four subregions $R_{1-1}$ to $R_{1-4}$ of the region $R_1$ are shown in the drawing. The subregions can themselves be subdivided into subregions, down to any number of levels. For example, the subregion $R_{1-1}$ is shown as being subdivided into four subregions $R_{1-1-1}$ to $R_{1-1-4}$.

It is further within the scope of the invention to combine the arrangements of FIGS. 3 and 4. For example, the cell region 54a of FIG. 3 can be hierarchically subdivided into subregions as illustrated in FIG. 4. The designation of regions in which cells, wiring segments, etc. are to be assigned is arbitrary, specified by the user, and is not limited to any particular configuration within the scope of the invention.

Figure 5:
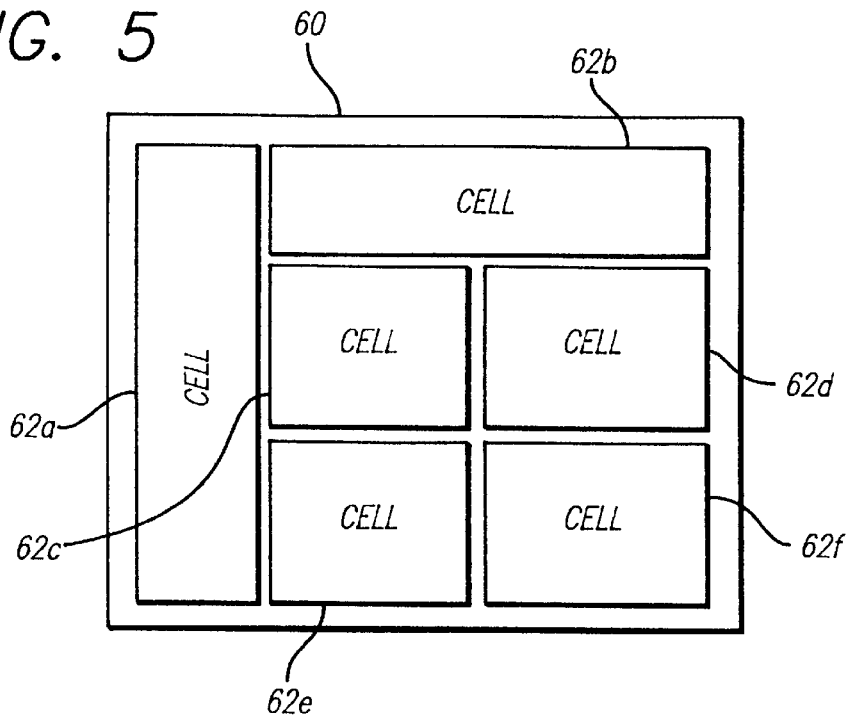
FIG. 5 is a diagram illustrating how cells which are placed by the present system can have different sizes and shapes.

Further, as illustrated in FIG. 5, cells which are to be assigned to regions can have the same size and shape or, as illustrated, have different sizes and shapes. For example, a region 60 can have cells 62a to 62f having different heights and widths assigned to and placed therein.

The following conventions will be used in the detailed description of the present invention.

| | |
|---|---|
| H | hypergraph |
| $Q_h$ | net |
| h | index for net |
| q | subset of nets connected to a cell |
| T | subset of regions containing cells of one net |
| $O_i$ | cell or cluster (object or vertex) |
| i | index for cells or clusters |
| n | number of cells or clusters |
| $S_i$ | size of cell or cluster |
| $R_j$ | region |
| j | index for region |
| m | number of regions |
| $c_j$ | capacity of region |
| $\psi$ | penalty |
| $\Psi$ | normalized penalty |
| $\Delta\Psi$ | normalized penalty change |
| F | assignment |
| p | permutation |
| $I_r$ | subinterval |
| r | index for subinterval |
| k | number of subintervals |
| x | subinterval corresponding to $V_L$ |
| $\delta$ | accuracy parameter |
| M | maximum normalized penalty |
| $V_L$ | group size |
| L | index for group size |
| $V_T$ | maximum group size |
| $V_o$ | optimal group size |
| C | group size constant |
| $\lambda$ | total size of objects in subinterval |
| $\Omega$ | change of cost function for moving $V_L$ group size |

The present invention provides a process for partitioning a large number, for example several hundred thousand or more, microelectronic device cells into a relatively small number of regions on an integrated circuit chip.

The process of partitioning involves assigning individual cells to the regions of the chip such that a cost or penalty function, such as total wirelength of the placement, is minimized. The problem which is solved by the invention can be alternatively be described as partitioning or assignment of cells to regions.

Expressed using the notation of graph and set theory, the problem comprises specifying a hypergraph H consisting of a set O of vertices (objects), a set Q of hyperedges, and sizes s of the objects such that H=(O,Q,s).

In the present application of design automation for integrated circuit chips, the hypergraph represents the input data specifying the cells which are to be placed on the chip, and the wiring which interconnects the cells. The set O of vertices or objects represents the set of cells, the set Q of hyperedges represents the wiring nets which interconnect the cells, and the sizes s represent the sizes of the cells.

The problem also comprises specifying a set R of regions into which the cells are to be partitioned (assigned or mapped), and a set c of the sizes of the regions. The set R of regions represents the regions or areas on the chip in which the cells are to be placed, and the set c of sizes represents the sizes or capacities of the regions for containing cells expressed as area, height or width.

The present invention simultaneously partitions or assigns cells to all regions simultaneously, and therefore can be described as "multiway", as opposed to the prior art two way partitioning as represented by the min-cut algorithm.

Solution of the problem consists of finding a partitioning or assignment F:O→R which is subject to the following constraints $$(\forall\, j \in R)\left(\sum_{i \in O, F(i)=j} s(i) \leq c(j)\right)$$

The steps of the present process are illustrated in FIG. 7. The first step is to generate an initial placement of the cells either randomly, or using an optimization-driven placement technique such as the above referenced GORDIAN. Another alternative for generating the initial placement is a force directed placement method.

An initial partitioning and clustering of the cells can be generated randomly, using a greedy algorithm such as the "min-cut" algorithm as described in "A Linear Time Heuristics for Improving Network Partitions", C. M. Fiduccia and R. M. Mattheyses, Proc. of the 19th Design Automation Conference, pp. 175–181, 1982, or using any other method as long as the capacities $c_j$ of the regions $R_j$ are not exceeded as indicated above.

Clustering of the cells involves combining cells into groups or "clusters" of cells which are closely associated with each other by virtue of their interconnections as represented by the net list. The clusters are then operated on as integral units for the purposes of assignment to hierarchical levels of subregions as will be described in detail below.

Figure 8A:
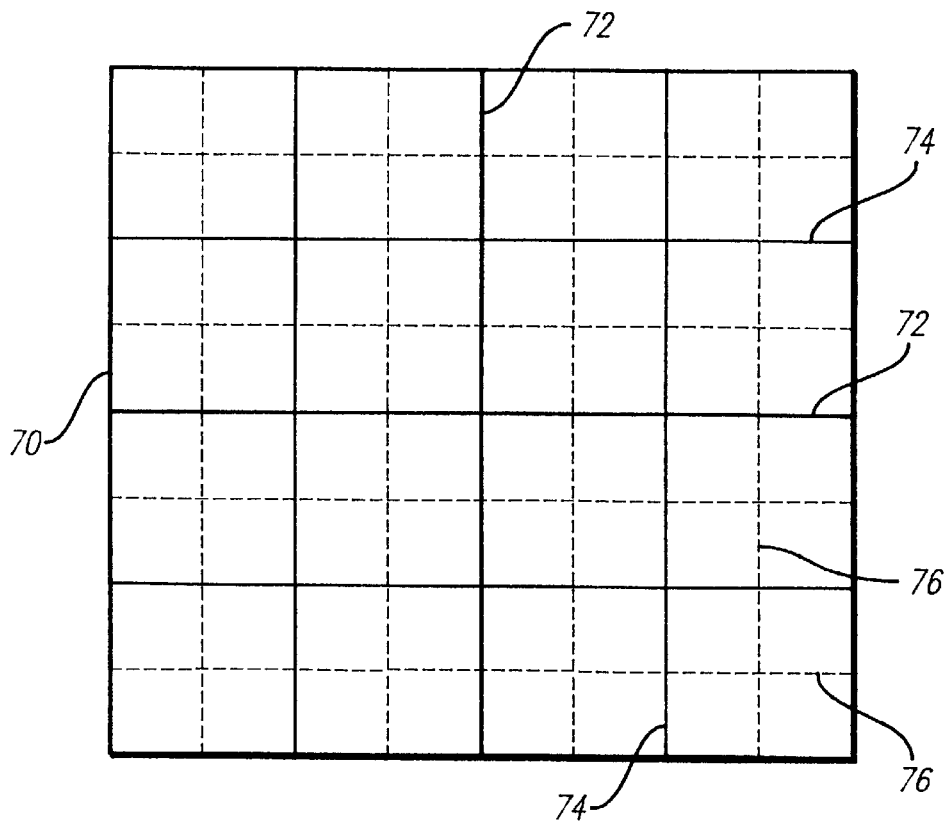
FIGS. 8a to 8e are diagrams illustrating how an integrated circuit chip is hierarchically subdivided into levels and sublevels, and how the regions at each level are organized into four sieve-like configurations or "jiggles"

The chip area (or the area of a single large region if there are disjoint regions) is divided into a hierarchical arrangement of subregions as illustrated in FIG. 8a. This is accomplished by progressively subdividing or quadrasecting the chip or large region, which is designated as 70, into a number of levels which depends on the number of cells to be placed.

FIG. 8a illustrates subdivision into four hierarchical levels: Level 0, which consists of the entire chip or large region; level 1 which consists of four subregions delineated by thick lines 72; level 2 which consists of 16 subregions delineated by thin solid lines 74; and level 3 which consists of 64 subregions delineated by broken lines 76.

The number of subregions SR for a given level is given as SR=$4^{LN}$, where LN is the level number. For example, for level 3, SR=$4^3$=64. The numbers of subregions therefore have the sequence 1, 4, 16, 64, 256, 1,024, 4,096 . . . .

The number of clusters and levels of quadrasection is preferably selected such that the clusters on the lowest level consist of single cells, and there are 5 to 10 cells in each subregion. For example, for an integrated circuit chip or large region in which 30,000 cells are to be placed, the lowest level would be selected as level 6, consisting of 4,096 subregions. This would give an average value of 30,000/4,096=7.32 clusters (cells) per subregion.

The number of clusters per subregion for the first level on which the process is to operate, more specifically level 2 which consists of 16 subregions, is also preferably 5 to 10. Assuming the median value of 7.5 clusters per subregion, the total number of clusters for level 2 is 16×7.5=120, and the average number of cells per cluster is 30,000/120=250.

The numbers of clusters, and cells per cluster in the present example can be summarized as follows, assuming an average of 7.5 clusters/subregion for levels 2 to 5.

| Level | Subregions | Clusters | Cells/cluster | Clusters/subregion |
|---|---|---|---|---|
| 0 | 1 | N/A | N/A | N/A |
| 1 | 4 | N/A | N/A | N/A |
| 2 | 16 | 120 | 250 | 7.5 |
| 3 | 64 | 480 | 62.5 | 7.5 |
| 4 | 256 | 1,920 | 15.6 | 7.5 |
| 5 | 1,024 | 7,680 | 3.9 | 7.5 |
| 6 | 4,096 | 30,000 | 1 | 7.32 |

It will be understood that the above numbers are averages. Clusterization is performed at each level so that there will be approximately 5 to 10 clusters per subregion.

Figure 8B:
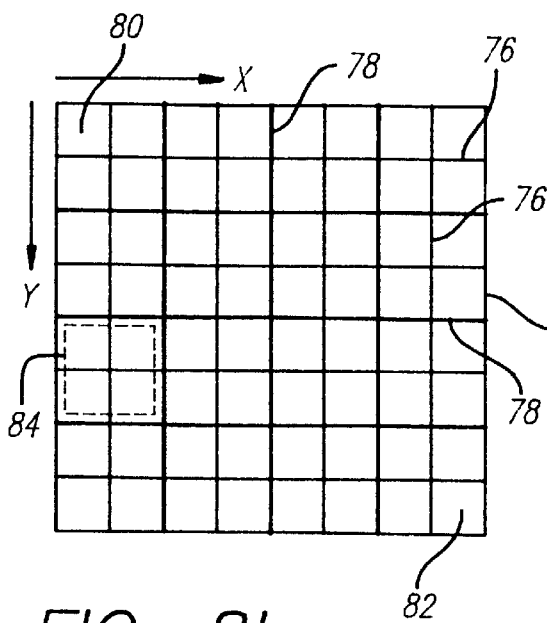
Figure 8C:
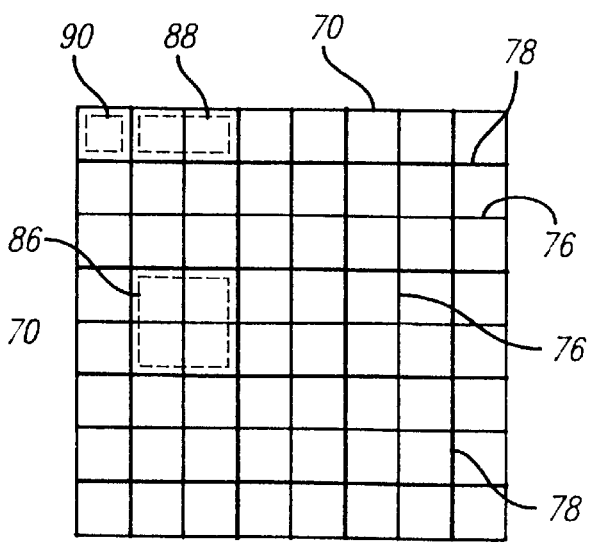

After the clusters for the first level, more specifically level 2, are generated, they are re-assigned to the 16 subregions of the level 2 grid. This is accomplished by means of "jiggles" as illustrated in FIGS. 8b to 8e. The lines which subdivide the chip 70 in these figures correspond to the line 76 in FIG. 8a. It will be noted that FIGS. 8b to 8c illustrate the jiggles for level 3 which consists of 64 subregions.

FIGS. 8b to 8e include both the thin lines 76, and thick lines 78. The thick lines 78 constitute a grid which divides the chip 70 into groups of regions which collectively constitute a jiggle.

FIG. 8b illustrates "Jiggle 00". An orthogonal coordinate system is defined having a rightwardly extending X axis and a downwardly extending Y axis. Subregions are designated by their X and Y coordinates, such that a subregion 80 in the upper left corner has coordinates 0,0, and a subregion 82 in the lower right corner has coordinates 15,15.

The grid of thick lines 78 and the edges of the chip 70 define groups of subregions. For example, a group 84 consists of the subregions having X,Y coordinates (1,5), (2,5), (1,6) and (2,6).

FIG. 8c illustrates "Jiggle 11", in which the grid of lines 78 is shifted by one coordinate unit in both the X and Y directions. It will be noted that not all groups of regions include four subregions. All of the groups along the edges of the chip 70 include one or two subregions.

Figure 8D:
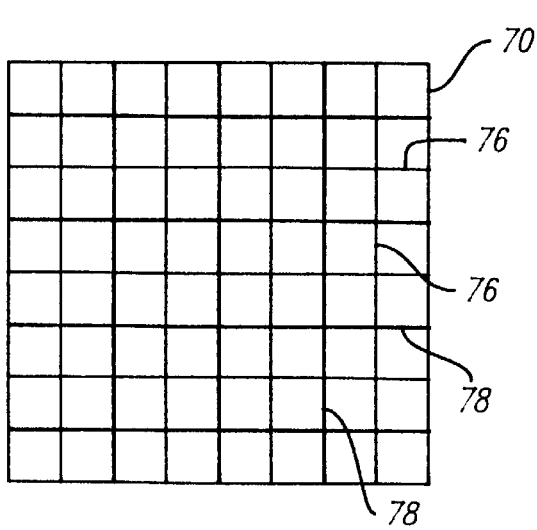
Figure 8E:
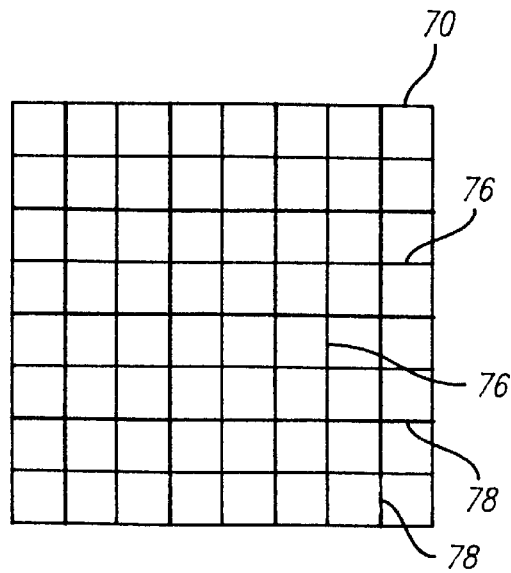

FIG. 8d illustrates "Jiggle 01", in which the grid of lines 78 is shifted by one coordinate unit in the Y direction. FIG. 8e illustrates "Jiggle 10" in which the grid of lines 78 is shifted by one coordinate unit in the X direction.

The next step of the process is to re-assign the clusters in the groups of regions to the individual regions such that cost or penalty function is minimized. The penalty function is preferably total wirelength or a function thereof as will be described in detail below. The object is to minimize the total wirelength or other penalty function.

This is accomplished by using a technique such as "min-cut", or more preferably an assignment methodology which will be described in detail below, to assign the clusters within each group of regions using one jiggle, then using another jiggle, etc., with the jiggles being alternated according to a predetermined or random permutation. The jiggles resemble and perform a function which is comparable to a mechanical sieve.

As illustrated, for example, in FIG. 8c, where Jiggle 11 is being used, the clusters in a group 86 of four subregions, and the clusters in a group 88 of two subregions, are re-assigned such that the penalty function is minimized. The clusters in a group 90 which consists of only one subregion can be unaltered, or can be relocated using simulated annealing or other appropriate method.

Each jiggle operation can be performed once, using one jiggle or a predetermined or random set or sequence of jiggles. Alternatively, each jiggle operation can be performed repeatedly until an end criterion is reached.

The cost function can be calculated after each jiggle or set or sequence of jiggles has been performed once or a predetermined number of times.

The cost function can be the total wirelength of the placement, or can be any other parameter. For example, the cost function can be calculated using the methodology of the min-cut algorithm as the number of nets crossing the lines between the subregions.

Alternatively, the parameter on which the end criterion is based can be the difference between the cost functions computed after performing two consecutive jiggle operations respectively. In other words, the parameter in this example is the amount by which the cost function was changed by performing the last operation. The jiggle operations are performed repeatedly until the difference in cost function between two consecutive operations is less than a predetermined value.

The re-assignment process is preferably performed using parallel processors. Since re-assignment is performed within respective groups of subregions for each jiggle, the assignments within one group do not affect any other groups. Therefore, the assignments for a plurality or, for maximum computing speed, all of the groups, is performed simultaneously (concurrently) using respective parallel processors.

The highly parallel nature of the present process overcomes a drawback of the prior art by enabling optimal solutions to be achieved with low computational run times.

As illustrated in FIGS. 9a to 9g, alternating re-assignment using two or more jiggles enables a cluster to be moved from any initial location on the chip 70 to its optimal location as determined by the net list. These figures illustrate alternating use of Jiggles 00 and 11.

Figure 9A:
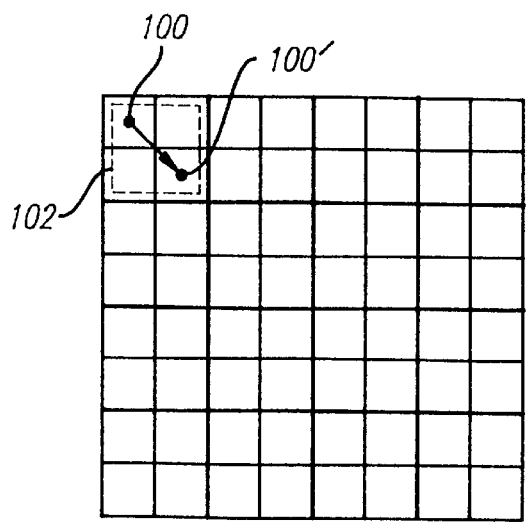
FIGS. 9a to 9g are diagrams illustrating how a cluster or cell can be moved from one extreme location to another extreme location on a chip.

In FIG. 9a, a cluster 100 is initially assigned to the subregion with coordinates 0,0. It will be assumed that the optimal location for the cluster 100 is at the extreme opposite end of the chip, in the subregion with coordinates 15,15. The group of regions in which the cluster 100 is located is designated as 102.

A first application of Jiggle 00 enables the cluster 100 to move diagonally downward to the subregion with coordinates 1,1. Throughout FIGS. 9a to 9g, the initial position of the cluster is designated as 100, its new position after re-assignment is designated as 100', and the group of regions in which the cluster 100 is subjected to re-assignment is designated as 102.

Figure 9B:
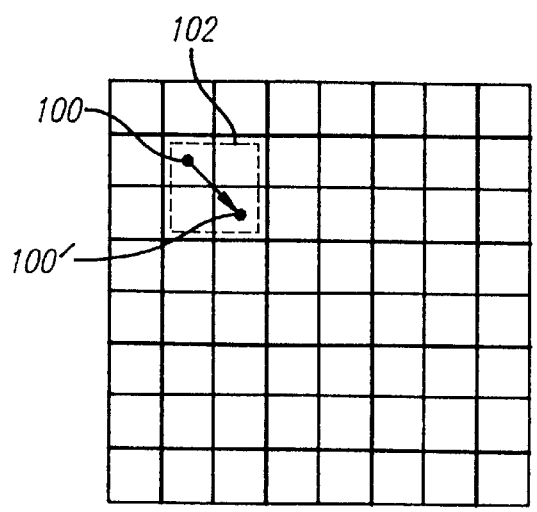
Figure 9C:
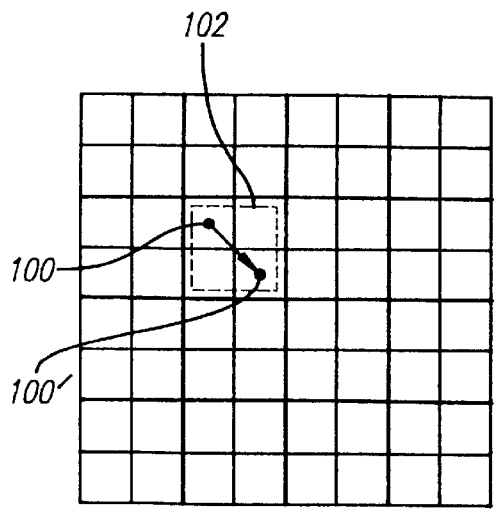
Figure 9D:
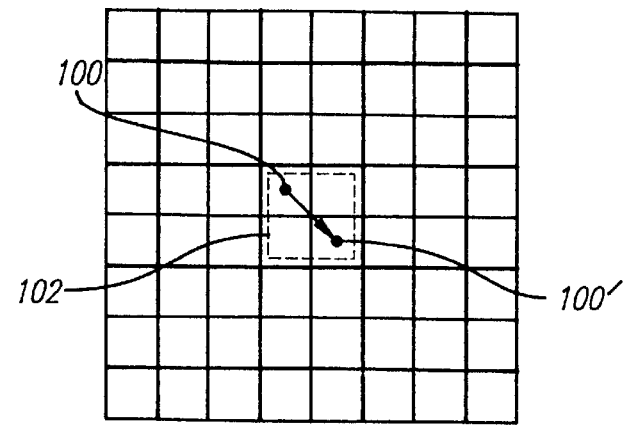
Figure 9E:
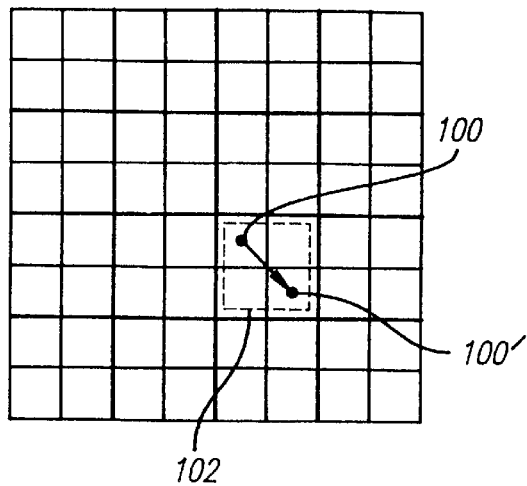
Figure 9F:
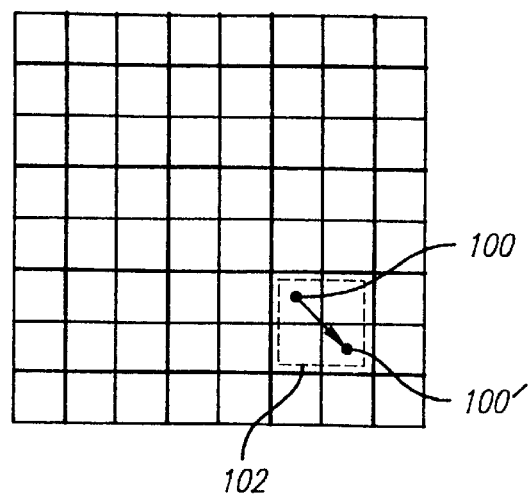

In FIG. 9b, re-assignment using Jiggle 11 is performed, and the cluster 100 is again moved diagonally downward to the subregion with coordinates 2,2 as indicated at 100'. The group 102 of subregions in which the cluster 100,100' is re-assigned in FIG. 9b is shifted by coordinate units 1,1 from the position of the current group 102 as illustrated in FIG. 9a.

Figure 9G:
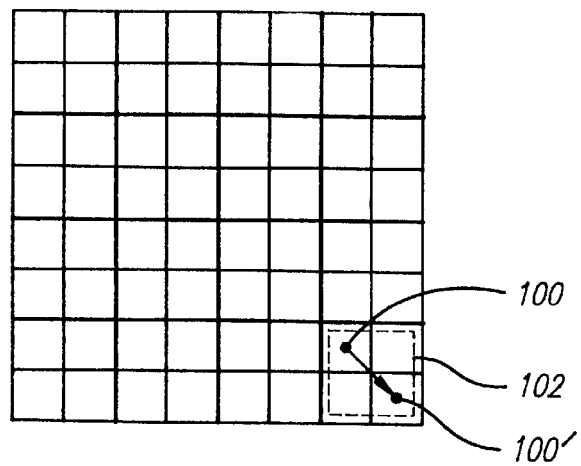

This process is progressively applied as illustrated such that the cluster 100 is ultimately moved to the subregion with coordinates 15,15 as shown in FIG. 9g.

In summary, re-assignment of clusters to subregions within respective groups is performed using different jiggles in an alternating manner. This overcomes a drawback of the prior art in that clusters are allowed to move from any location on the chip to any other location. Thus, placement and partitioning are performed simultaneously in an unlimited manner.

Next, the clusters for the current level are either quadrasected in any suitable manner, or a complete reclustering is performed which produces approximately four times more clusters containing approximately one-fourth as many cells as the clusters from the previous level. The smaller clusters are assigned to the subregions in the current level as will be described in detail below, and the jiggle operation is again performed until an end criterion is reached.

After re-assignment has been completed on one hierarchical level such that the cost or penalty function has been reduced below a predetermined value or another end criterion has been reached, the subregions are quadrasected as described with reference to FIG. 8a. The smaller clusters as assigned to the smaller (quadrasected) subregions as will be described in detail below, and the jiggle operation is again performed.

The jiggle and re-assignment operation is repeated for each level using alternating jiggles in the manner described above. The operations of assignment and moving to the next lower level are progressively performed until the lowest level is reached or another suitable end criterion is reached.

At the lowest level, the clusters preferably consist of individual cells, with each subregion containing 5 to 10 cells. The cells in the smallest subregions are placed in their ultimate physical locations using any suitable placement methodology.

When moving from one hierarchical level to a lower level, the subregions are subdivided (quadrasected) to form four times as many subregions which are one-fourth the size of the subregions of the next upper level. The jiggles are defined such that each group consists of four (some 2 or 1) subregions.

However, it will be understood that the scope of the invention is not limited to the particular configuration shown and described, and that the subregions can be subdivided into more or less than four smaller subregions, and there can be any number of jiggles defining grids of any suitable sizes.

It is further within the scope of the invention to perform the present process on only one level of subregions as an improvement to a random placement and assignment, or to a placement and assignment generated by another process such as the GORDIAN and/or min-cut methodologies.

For example, the invention can be performed to improve a placement of cells which is generated by any methodology, without grouping the cells into clusters and without providing hierarchical levels.

When generating new, smaller clusters on each level as described above, the number of clusters is increased by a factor of approximately four to produce the smaller clusters which contain approximately one-fourth as many cells as in the previous level. This may be performed by merely quadrasecting the clusters of the previous level.

Alternatively, a complete reclustering can be performed starting with the individual cells which produces the requisite number of clusters for the new level. This enables further movement of the new, smaller clusters between regions on the chip.

Figure 10A:
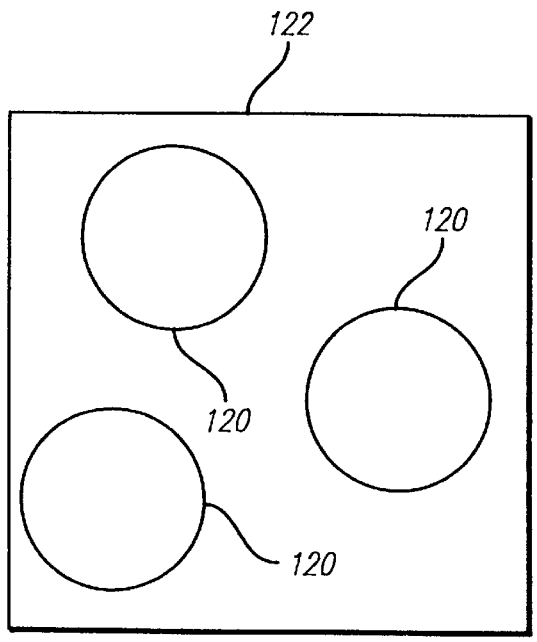
FIGS. 10a to 10d are diagrams illustrating how clusters of cells are subdivided or re-clustered to produce smaller clusters, and are assigned to regions on the chip.

In this latter case, the new clusters are assigned to the current subregions prior to the sieve optimization with the jiggles. As illustrated in FIG. 10a, clusters 120 are assigned to a subregion 122. The clusters 120 as illustrated as being spaced from each other in the subregion 122 for clarity of illustration. However, the assignment of clusters to subregions is actually based on the netlist (hypergraph) interconnections, and does not have a physical basis. For the purpose of calculating the cost function, all clusters in a subregion are considered to be located at the center of the subregion.

Although only one subregion 122 is illustrated in the drawings, it will be understood that the description applies to all subregions in each level starting with the first operative level which contains 16 subregions.

Figure 10B:
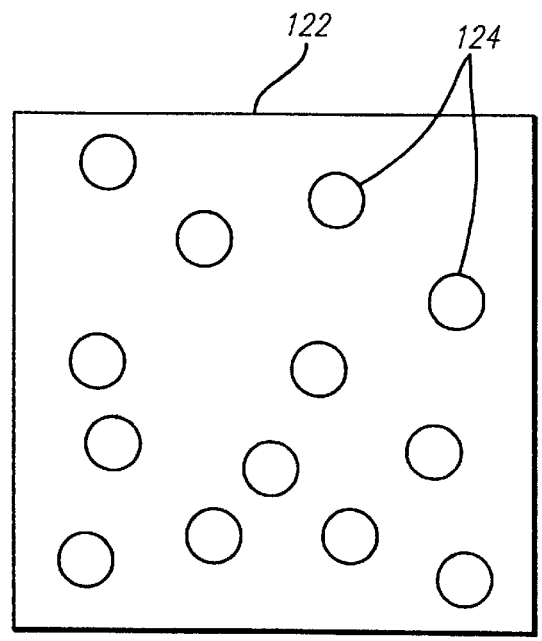

FIG. 10b illustrates how the clusters 120 are broken up and reformed into new, smaller clusters 124 such that the number of clusters 124 is approximately 4 times the number of clusters 120. Again, the clusters 124 are shown as being spaced from each other for simplicity of illustration.

If the clusters 124 are produced by merely quadrasecting the clusters 120, all of the clusters 124 will be in the same subregion as the clusters 120. However, if the clusters 124 are produced by a complete re-clusterization from the cell level, the smaller clusters 124 will be assigned to the subregion 122 or another subregion (not shown) in the current level. This is accomplished by determining the cluster 120 to which each cluster 124 is most closely associated, as will be described in detail below, and assigning the cluster 124 to the subregion in which this cluster 120 is assigned.

If, however, assigning the cluster 124 to this subregion would result in exceeding the capacity of the subregion, the cluster 120 to which the cluster 124 is next most closely associated is determined, and the cluster 124 is assigned to this subregion. If necessary, the process can be continued until a subregion is found such that assigning the cluster 124 to the subregion will not result in exceeding the capacity.

The distance between a cluster 124 and a cluster 120 is not physical, but is determined by netlist (hypergraph) interconnections.

For example, the clusters 120 and 124 can be grown using selected cells (vertices) as centers. In this case, the distance between the clusters 120 and 124 can be defined as the shortest path through the nets (hyperedges) in the hypergraph that interconnects these cells.

The length of a path can be calculated as the sum of the lengths of all hyperedges interconnecting the cells, with the length of each hyperedge being equal to the number of pins (vertices) in the hyperedge minus one. The shortest path is the path having the smallest length.

After the smaller clusters 124 are assigned to the subregion 122 and the other subregions in the current level, the jiggle operation is performed as described above which can result in movement of the smaller clusters 124 between the subregions.

Figure 10C:
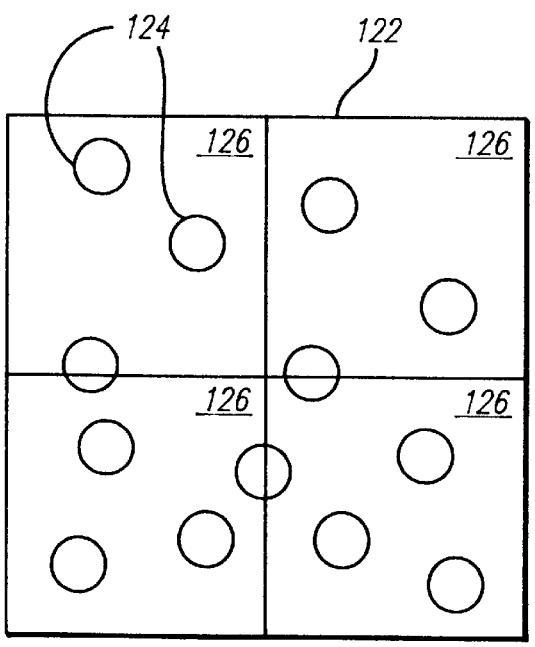

FIG. 10c illustrates how the subregion 122 is quadrasected to form four smaller subregions 126. The lines between adjacent subregions 126 are illustrated as passing through some of the clusters 124 to represent that the clusters 124 have not at this stage been assigned to the subregions 126.

Figure 10D:
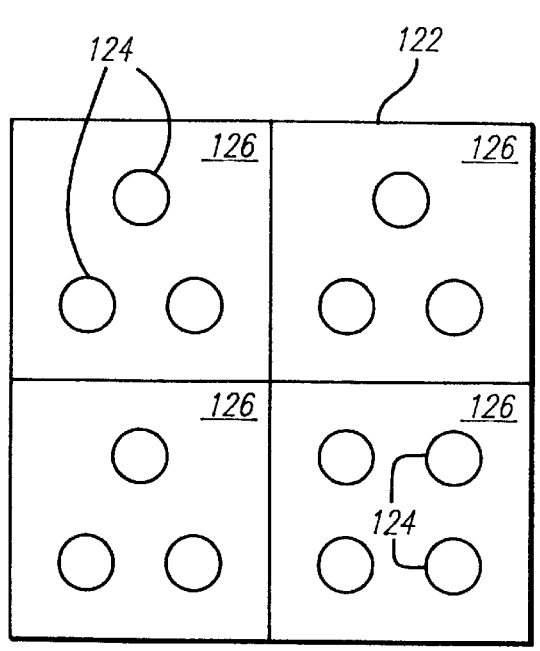

FIG. 10d illustrates the next step in which the clusters 124 are assigned to the subregions 126. The drawing shows 13 clusters 124, with three clusters 124 being assigned to each of three respective subregions 126, and four being assigned to one subregion 126.

The preferred method for assigning the clusters to the subregions within each group will be described below with reference to FIGS. 11 to 20.

As the first step, penalties $\psi$ are specified for assigning each cluster to each region (subregion) $R_j$. For cluster placement, a penalty can be considered as a negative affinity, with the affinity being an attractive force determined by a conventional force directed placement algorithm based on a model of masses and springs.

The number n of clusters $O_i$, sizes $s_i$ of clusters O, number m of regions $R_j$, capacities $c_j$ of regions m, and penalties $\psi(i,j)$ for assigning the cluster $O_i$ to region $R_j$ are specified by the user as a two dimensional array having the form illustrated in FIG. 11. The capacity $c_j$ of a region $R_j$ is the size (area) of the region which is available to have clusters placed therein.

Figure 6:
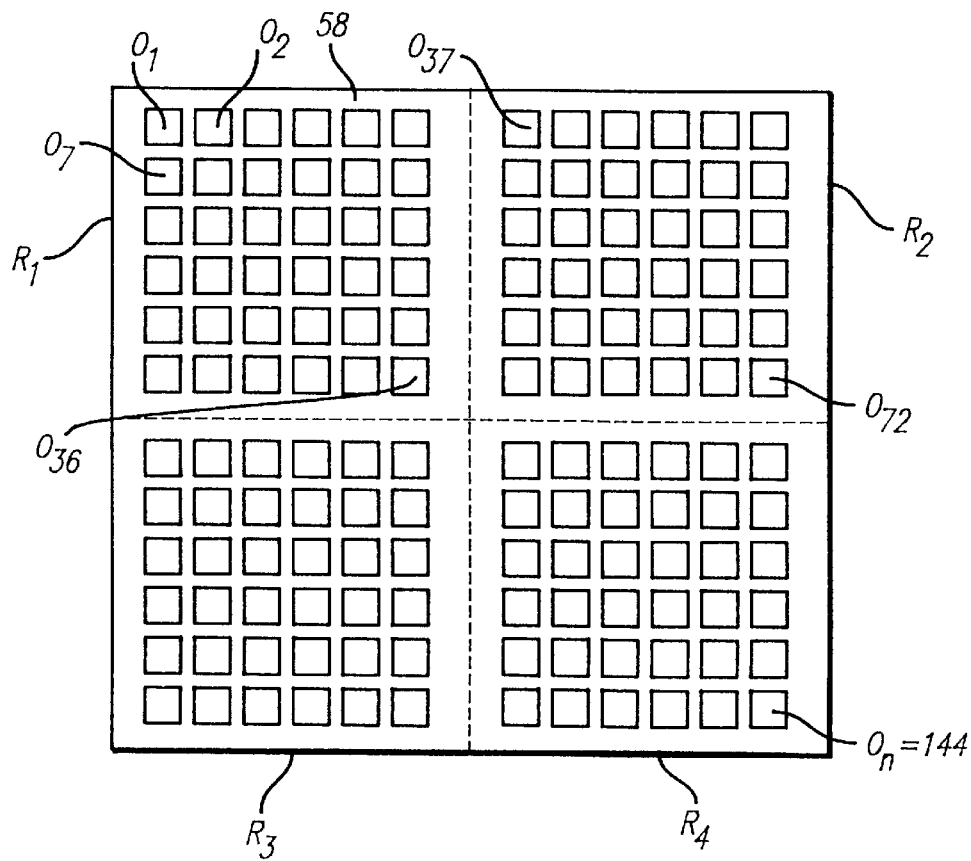
FIG. 6 is a diagram illustrating an initial assignment of a plurality of cells to a plurality of regions on a chip.

There will generally be more clusters than subregions (5 to 10, although the invention is not so limited). FIG. 6 illustrates a simplified chip 58 in which 36 clusters $O_i$ are to be placed in each region $R_j$, where n=144 and m=4. Although the clusters $O_1$ to $O_{144}$ are illustrated as having the same size and shape, they can have different sizes and shapes within the scope of the invention.

FIG. 12 is a flowchart illustrating the main process steps of the assignment methodology. The following detailed description will be presented within the framework of the flowchart.

The generalized assignment problem can be formulated as follows.

Given set of n clusters $O_1 \ldots O_n$ with sizes $s_1 \ldots s_n$, regions $R_1 \ldots R_m$ with capacities $c_1 \ldots c_m$ and a penalty $\psi(i,j)$ of the cluster $O_i$ to be in the region $R_j$ for each i=1 . . . n and j=1 . . . m (n×m matrix).

A permissible assignment F:F(i)=j, of the cluster $O_i$ to the region $R_j$ is an assignment which satisfies the condition that for each region, the sum of sizes of all clusters assigned to that region is not greater than the capacity of the region. The cost function of the assignment F is equal to the total penalty:

$$COST(F) = \sum_{i=1}^{n} \psi(i, F(i))$$

The goal is to find the assignment F with the minimal COST(F).

After specifying the clusters, regions, capacities and penalties as described above, a normalized penalty change scale is constructed as illustrated in FIG. 13. Normalized penalties $\Psi(i,j)$ are computed by dividing the penalties $\psi(i,j)$ by the sizes of the clusters as $$\hat{\psi}(i,j) = \frac{\psi(i,j)}{s_i}$$

The normalized penalty change $\Delta\Psi$ resulting from moving each cluster between each two regions is then computed. For example, if an cluster has a normalized penalty $\Psi_1$=−4 in a region $R_1$ and a penalty $\Psi_2$=−6 in a region $R_2$, and is moved from the region $R_1$ to the region $R_2$, the normalized penalty change $\Delta\Psi$=(−6)−(−4)=−2.

The normalized penalty change scale is specified as having a minimum (most negative) value −M and a maximum (most positive) value +M, where $$M = 2 \times MAX|\Psi(i,j)|$$

The normalized penalty change scale is divided into k subintervals $I_r = I_1 \ldots I_k$, where k≈2M/δ, and δ is a constant;

The normalized penalty change scale has maximum values −M and +M equal to twice the maximum value of normalized penalty to accommodate a maximum penalty change in either direction. For example, if the maximum penalty for all clusters is −5, and an cluster is moved from a region having a penalty of −5 to a region having a penalty of +5, the penalty change will be (+5)−(−5)=+10, or twice the maximum normalized penalty.

Since penalty is the negative of affinity, negative penalty changes are desirable since they decrease the cost of the assignment. It will be noted that if all clusters have the same width or height, all normalized penalties $\Psi$ will be proportional to the penalties $\Psi$ by the same proportionality constant, and the normalization computation can be omitted.

The quantity $\delta$ is the "accuracy factor", and is selected in accordance with the characteristics of the computer on which the design automation program is run. Smaller values of $\delta$ will result in greater accuracy and longer computing time, and vice-versa. It will be further noted that the last subinterval $I_k$ can have a value of less than $\delta$.

The next step in the present process is the construction of a group size scale $V_L=[C^{L-1}]$, $C>1$, where $V_L=V_1 \ldots V_T$ are the group size values, C is a constant, and T is a maximum number such that:

$$V_T < \sum_{i=1}^{n} s_i$$

The latter constraint signifies that the total size of clusters to be moved cannot exceed the total size of all of the clusters. The value C is selected based on characteristics of the particular application, more specifically on the unit of measurement for the cluster sizes. If, for example, C=2, the values of $V_L$ will be $V_1=1$, $V_2=2$, $V_3=8$, $V_4=16$, $V_5=32$, etc.

The next step of the present process is to construct an initial permissible assignment which is to be improved upon by the invention. The initial assignment can be generated randomly, or by using another algorithm. The constraint which must be satisfied is, as set forth above, that for each region, the sum of sizes of all clusters assigned to that region is not greater than the capacity of the region.

Then, an initial value is assigned to L. The preferred initial value of L is T, although the invention is not so limited. Thus, the initial value of $V_L=V_T$.

The present invention produces a rapid improvement in the initial assignment (and iteratively improved versions thereof) by moving the maximum number of clusters between regions which will produce a maximum reduction in the cost of the assignment. This is done by moving the selected number of clusters which have the largest negative normalized penalty changes through a complete permutation of the regions.

For example, if there are four regions $R_1$–$R_4$, one possible permutation is 1-2-3-4, whereas another possible permutation is 1-3-4-2. The number of possible permutations is m-factorial (m!). Thus, for four regions, the number of possible permutations is 4!=24.

No region capacities will be exceeded upon completion of a permutation because the same number of clusters is removed from and returned to each region. Although region capacities can be exceeded at intermediate stages of permutations, this does not affect the result of the process.

The number of clusters to be moved in the first iteration ($V_L=V_T$) is determined by computing a three dimensional array of cluster sizes $\lambda(r,j_1,j_2)$, in which $\lambda$ represents the total size of the clusters in each subinterval r for each pair of regions $j_1$ and $j_2$. An cluster lies in a subinterval if its normalized penalty change $\Delta\psi$, when the object is moved from $j_1$ to $j_2$, has a value within the subinterval. The array can be expressed as:

$$\lambda(r,j_1,j_2) = \Sigma \ s_i, F(i)=j_i, \ (\Psi(i,j_2)-\Psi(i,j_1)) \Sigma I_r$$

where r is an index for the subintervals and $$\Delta\Psi = \Psi(i,j_2) - \Psi(i,j_1)$$

FIGS. 14 and 15 illustrate the array $\lambda(r,j_1,j_2)$, where FIG. 14 represents a two dimensional portion of the array for a given value of r, and FIG. 15 represents a one dimensional portion of the array for given values of $j_1$ and $j_2$. There are m(m−1) non-trivial values of $\lambda$.

Then, an array of numbers x of subintervals $I_r$ is computed as $$\sum_{r=1}^{x} \lambda(r, j_1, j_2) < V_l < \sum_{r=1}^{x+1} \lambda(r, j_1, j_2)$$

Each value of x is equal to the maximal number of subintervals $I_r$ which contain clusters having a total size no greater than $V_L$ for each respective value of $V_L$, and each pair $j_1,j_2$.

Thus, for each value of group size $V_L$ (the initial group size is $V_T$), a number x of subintervals containing the corresponding number of clusters is computed. Since the subinterval numbers increase with increasing value of normalized penalty change, the clusters which produce the maximal reduction in cost function (negative penalty change) are selected for movement.

FIG. 16 illustrates an example of the computation of the values of x for one pair $j_1,j_2$. It will be assumed that MAX|$\Psi$| =98, 2M=196 and $\delta$=5. k=196/5=39.2, which is rounded up to 40. Thus, there are 40 subintervals $I_r$, with the subintervals $I_1$–$I_{39}$ having values of |5|, and the last subinterval $I_{40}$ having a value of |1|.

The values of normalized penalty change $\Delta\psi$ for the first six subintervals $I_1$ to $I_6$ are:

| | |
|---|---|
| $I_1$ | −196 to −192 |
| $I_2$ | −191 to −187 |
| $I_3$ | −186 to −182 |
| $I_4$ | −181 to −177 |
| $I_5$ | −176 to −172 |
| $I_6$ | −171 to −167 |

For purposes of example, it will be assumed that T=5, and $V_T=2^{(5-1)}=2^4=32$.

The subinterval $I_1$ includes two clusters $O_{23}$ and $O_4$ having normalized penalty changes $\Delta\Psi$ of −194 and −192, and sizes s of 4 and 5 respectively. The subinterval $I_2$ contains one cluster $O_{18}$, the subinterval $I_3$ contains one cluster $O_{31}$, the subinterval $I_4$ contains no clusters, the subinterval $I_5$ contains three clusters, and the subinterval $I_6$ contains one cluster.

The total group size $V_5$=32. The subintervals $I_1$–$I_5$ contain clusters having a total size of 4+5+1+6+5+4+2=27. The subintervals $I_1$–$I_6$ contain clusters having a total size of 34. Thus, x=5, and x+1=5+1=6, for L=5. This relationship is further illustrated in FIG. 17.

The next step is to compute an array of penalty changes $\Omega$ as:

$$\Omega(L, j_i, j_2) + \left(\sum_{r=1}^{x} \lambda(r, j_1, j_2)(-M + r\delta)\right) + \left(V_L - \sum_{r=1}^{x} \lambda(r, j_1, j_2)\right)(-M + (x+1)\delta)$$

This array is illustrated in FIG. 18, in which each element represents the change in total cost function created by moving clusters having total size $V_L$ between the corresponding two regions. There is a value of $\Omega$ corresponding to each value of x. FIG. 17 further illustrates how the effect is equal to the product of the total cluster size and the value of the subinterval.

With the effect of moving $V_L$ objects between each two regions known, an optimal permutation is determined for which the cost function is reduced by a maximum extent.

The optimal permutation p is expressed as $$p:\{1,2 \ldots m\} \to \{1,2 \ldots m\}$$

which maps numbers from 1 to m onto themselves.

A cost change EFFECT for each possible permutation p for the selected value of $V_L$ is computed as:

$$\text{EFFECT}(p, V_L) = \sum_{j=1}^{m} \Omega(L, j, p(j))$$

The value of EFFECT is obtained by summing the individual values of $\Omega$ for each move, with a value of EFFECT being computed for each possible permutation. The optimal permutation is the one with the highest negative value of EFFECT (negative change corresponds to reduction of cost function).

The value of L is then decremented, and the process is repeated for the next lowest value of $V_L$. The goal is to determine the highest value of L which will produce an increasing reduction of cost function. If the lower value of L produces a more negative value of EFFECT, the value of L is decremented again until the new lower value produces a less negative value of EFFECT. This is expressed mathematically as:

$$\text{EFFECT } (p_1, V_L) < \text{EFFECT } (p_2, V_{L-1})$$

Figure 20:
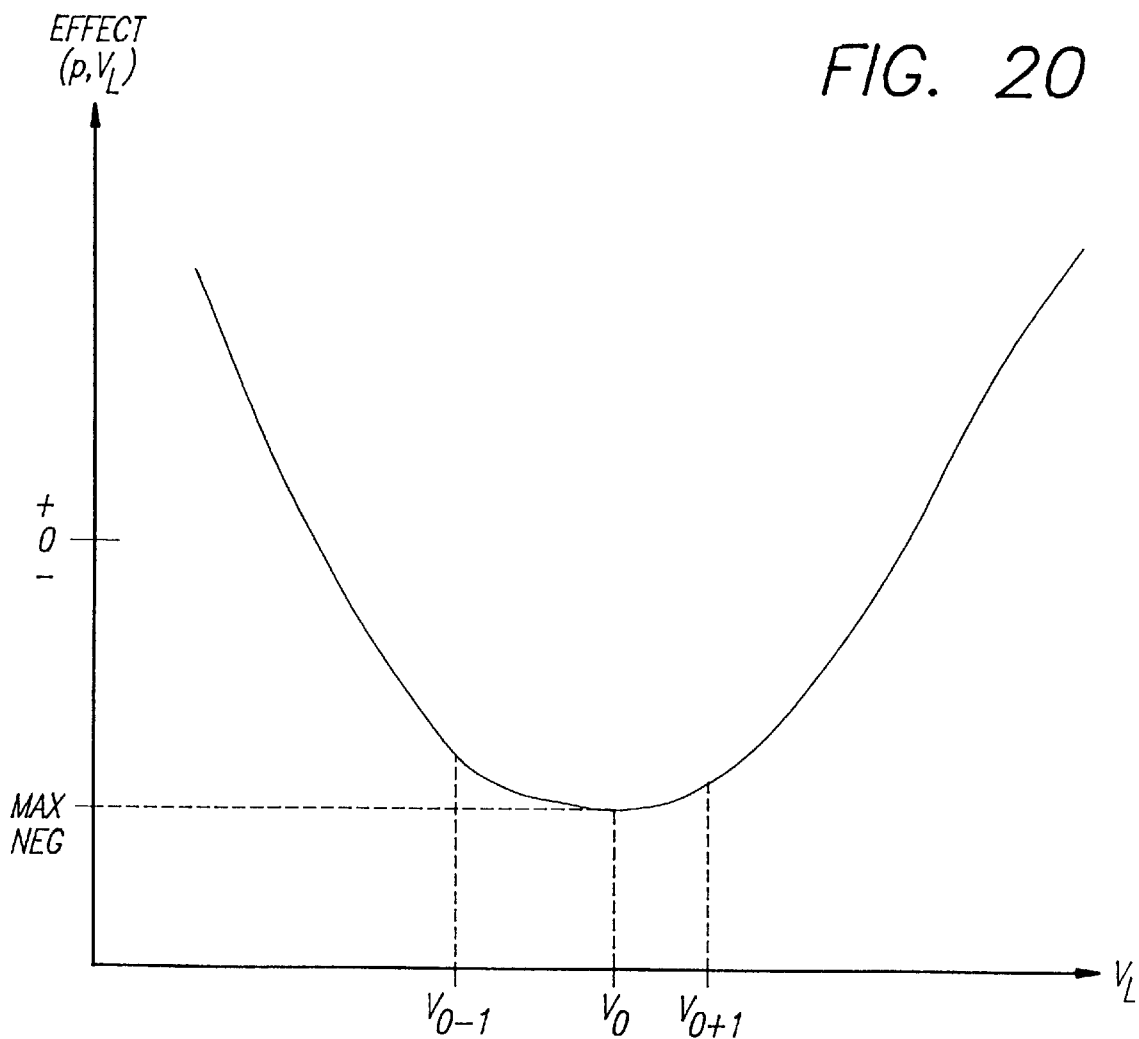
FIG. 20 is a graph illustrating computation of an optimum number of objects for movement.

As illustrated in FIG. 20, $V_o$ represents the current optimal value of $V_L$. It will be seen that the value of EFFECT varies approximately parabolically with $V_L$, and the value of $V_o$ produces a maximum negative value MAX NEG of EFFECT. A higher value $V_o+1$ produces a more positive value of EFFECT, as does a more negative value $V_o-1$.

Once the value $V_o$ and corresponding optimal permutation p have been determined, the assignment is modified by moving the number of clusters having size $V_L=V_o$ through the optimal permutation. The clusters for movement are selected by determining a subinterval r for each cluster as $$(\Psi(i,j_2) - \Psi(i,j_1)) \epsilon I_r$$

If $r \leq x$ (the cluster is in a subinterval equal to or larger than x), then $F(i)=j_2$ (the cluster is moved).

If $r>x$ (the cluster is in a subinterval greater than x), then $F(i)=F(i)$ (the cluster is not moved).

If $r=x+1$ (the cluster is in the subinterval x), then $F(i)=j_2$ with a probability $$\frac{V_L - \sum_{r=1}^{x} \lambda(r, j_1, j_2)}{\lambda(x+1, j_1, j_2)}$$

In the latter case, a random number generator or the like (not shown) is used to generate numbers with a probability equal to the above value that the numbers will have values greater than a predetermined value. A random number is generated for each cluster in the subinterval x+1. If the random number is larger than the predetermined value, the cluster is moved. If the random number is smaller than the predetermined value, the cluster is not moved.

After the assignment is modified, the process branches back as illustrated in FIG. 12 to determine a new optimal permutation for the modified assignment which may or may not have a decremented value of L.

The modification of the assignment is illustrated in more detail in FIG. 19 for a value of x=5. If an cluster is in a subinterval having a value r equal to or less than 5, it is moved. If an cluster is in a subinterval having a value r greater than x+1, it is not moved. If an cluster is in the subinterval x+1, it is moved with the probability described above.

The present invention solves the partitioning problem and the problem of placing the partitions on the chip simultaneously, therefore overcoming the drawbacks of the prior art. This is accomplished by concurrently assigning clusters to more than two regions (four regions), as compared to only two regions (bipartitioning) as in the prior art.

The present invention is also capable of improving on an initial partitioning or assignment produced using a min-cut or other methodology, and can also be considered as a placement improvement process.

The present invention yet further overcomes the limitations of the prior art in that it is capable of operating on clusters of different sizes and shapes. The complexity of the present process where implemented on a digital computer is linear, thereby producing results with greatly reduced run times as compared to the prior art.

Various modifications will become possible for those skilled in the art after receiving the teachings of the present disclosure without departing from the scope thereof.

We claim:

1. A process for designing an integrated circuit chip, comprising the steps of:
   (a) providing a placement of clusters of cells, each cluster being assigned to one of plural predefined and non-overlapping regions on the chip;
   (b) combining the pre-defined and non-overlapping regions to form region groups;
   (c) performing a first cluster placement improvement operation within respective region groups that re-assigns the clusters in each region group to the other pre-defined and non-overlapping regions in said each region group when a cell placement cost function is reduced;
   (d) re-combining the pre-defined and non-overlapping regions to form different region groups; and
   (e) performing a second cluster placement improvement operation within respective different region groups that re-assigns the clusters in each different region group to the other pre-defined and non-overlapping regions in said each different region group when a cell placement cost function is reduced.

2. A process as in claim 1, in which the regions in each region group are contiguous; and
   the regions in each different region group are contiguous.

3. A process as in claim 2, in which:
   the region groups partially overlap; and
   the different region groups partially overlap.

4. A process as in claim 3, further comprising the step of:
   (f) repeating steps (d) and (e) until an end criterion has been reached.

5. A process as in claim 4, in which the region groups are combined, and the different region groups are re-combined, such that each cluster can be re-assigned to any region in step (f).

6. A process as in claim 1, further comprising the step of:
(f) repeating steps (d) and (e) until an end criterion has been reached.

7. A process as in claim 6, further comprising the step of:
(g) specifying interconnections for the cells, in which:
the end criterion is such that a total length of the interconnections has been reduced below a predetermined value.

8. A process as in claim 1, further comprising the steps of:
(f) re-clustering the cells to form smaller clusters;
(g) subdividing the regions to form subregions;
(h) combining the subregions to form subregion groups;
(i) re-assigning the smaller clusters in each subregion group to the subregions in said each subregion group;
(j) re-combining the subregions to form different subregion groups; and
(k) re-assigning the smaller clusters in each different subregion group to the subregions in said each different subregion group.

9. A process as in claim 8, further comprising the step of:
(l) repeating steps (f) to (k) until an end criterion has been reached.

10. A process as in claim 9, in which the end criterion is such that a number of the subregions has been increased above a predetermined value.

11. A process as in claim 1, in which:
each region group comprises four contiguous regions; and
each different region group comprises four contiguous regions.

12. A process as in claim 11, in which:
the region groups partially overlap; and
the different region groups partially overlap.

13. A process as in claim 12, further comprising the step of:
(f) repeating steps (d) and (e) until an end criterion has been reached.

14. A process as in claim 13, in which the region groups are combined, and the different region groups are re-combined, such that each cluster can be re-assigned to any region in step (f).

15. A process as in claim 1, in which:
step (c) comprises the substeps, for each region group, of:
(f) specifying penalties for the cells to be placed in the regions respectively;
(g) constructing an assignment of the cells to the regions;
(h) selecting a number of cells for movement between the regions;
(i) computing an optimal permutation of movement of the selected number of cells between the regions such that a cost corresponding to the total penalties for the assignment is maximally reduced; and
(j) modifying the assignment by moving the selected number of cells through the optimal permutation; and
step (e) comprises the substeps, for each different region group, of:
(k) specifying penalties for the cells to be placed in the regions respectively;
(l) constructing an assignment of the cells to the regions;
(m) selecting a number of cells for movement between the regions;
(n) computing an optimal permutation of movement of the selected number of cells between the regions such that a cost corresponding to the total penalties for the assignment is maximally reduced; and
(o) modifying the assignment by moving the selected number of cells through the optimal permutation.

16. A process as in claim 15, in which:
step (i) comprises computing the optimal permutation as starting and ending in one of the regions; and
step (n) comprises computing the optimal permutation as starting and ending in one of the regions.

17. A programmed digital computer for designing an integrated circuit chip, comprising:
memory means for storing a program including instructions and data; and
processing means for executing the program;
the processing means, memory means and program operating in combination for performing the steps of:
(a) providing a placement of clusters of cells, each cluster being assigned to one of plural pre-defined and non-overlapping regions on the chip;
(b) combining the pre-defined and non-overlapping regions to form region groups;
(c) performing a first cluster placement improvement operation within respective region groups that re-assigns the clusters in each region group to the other pre-defined and non-overlapping regions in said each region group when a cell placement cost function is reduced;
(d) re-combining the pre-defined and non-overlapping regions to form different region groups; and
(e) performing a second cluster placement improvement operation within respective different region groups that re-assigns the clusters in each different region group to the other pre-defined and non-overlapping regions in said each different region group when a cell placement cost function is reduced.

18. A programmed digital computer as in claim 17, in which:
the regions in each region group are contiguous; and
the regions in each different region group are contiguous.

19. A programmed digital computer as in claim 18, in which:
the region groups partially overlap; and
the different region groups partially overlap.

20. A programmed digital computer as in claim 19, in which the processing means, memory means and program operating in combination further perform the step of:
(f) repeating steps (d) and (e) until an end criterion has been reached.

21. A programmed digital computer as in claim 20, in which the region groups are combined, and the different region groups are re-combined, such that each cluster can be re-assigned to any region in step (f).

22. A programmed digital computer as in claim 17, in which the processing means, memory means and program operating in combination further perform the step of:
(f) repeating steps (d) and (e) until an end criterion has been reached.

23. A programmed digital computer as in claim 22, in which the processing means, memory means and program operating in combination further perform the step of:
(g) specifying interconnections for the cells, in which:
the end criterion is such that a total length of the interconnections has been reduced below a predetermined value.

24. A programmed digital computer as in claim 17, in which the processing means, memory means and program operating in combination further perform the steps of:

(f) re-clustering the cells to form smaller clusters;

(g) subdividing the regions to form subregions;

(h) combining the subregions to form subregion groups;

(i) re-assigning the smaller clusters in each subregion group to the subregions in said each subregion group;

(j) re-combining the subregions to form different subregion groups; and (k) re-assigning the smaller clusters in each different subregion group to the subregions in said each different subregion group.

25. A programmed digital computer as in claim 24, in which the processing means, memory means and program operating in combination further perform the step of:

(l) repeating steps (f) to (k) until an end criterion has been reached.

26. A programmed digital computer as in claim 25, in which the end criterion is such that a number of the subregions has been increased above a predetermined value.

27. A programmed digital computer as in claim 17, in which:

each region group comprises four contiguous regions; and each different region group comprises four contiguous regions.

28. A programmed digital computer as in claim 27, in which the region groups partially overlap; and the different region groups partially overlap.

29. A programmed digital computer as in claim 28, in which the processing means, memory means and program operating in combination further perform the step of:

(f) repeating steps (d) and (e) until an end criterion has been reached.

30. A programmed digital computer as in claim 29, in which the region groups are combined, and the different region groups are re-combined, such that each cluster can be re-assigned to any region in step (f).

31. A programmed digital computer as in claim 17, in which:

step (c) comprises the substeps, for each region group, of:

(f) specifying penalties for the cells to be placed in the regions respectively;

(g) constructing an assignment of the cells to the regions;

(h) selecting a number of cells for movement between the regions;

(i) computing an optimal permutation of movement of the selected number of cells between the regions such that a cost corresponding to the total penalties for the assignment is maximally reduced; and (j) modifying the assignment by moving the selected number of cells through the optimal permutation; and step (e) comprises the substeps, for each different region group, of:

(k) specifying penalties for the cells to be placed in the regions respectively;

(l) constructing an assignment of the cells to the regions;

(m) selecting a number of cells for movement between the regions;

(n) computing an optimal permutation of movement of the selected number of cells between the regions such that a cost corresponding to the total penalties for the assignment is maximally reduced; and (o) modifying the assignment by moving the selected number of cells through the optimal permutation.

32. A programmed digital computer as in claim 31, in which:

step (i) comprises computing the optimal permutation as starting and ending in one of the regions; and step (n) comprises computing the optimal permutation as starting and ending in one of the regions.

* * * * *